United States Patent [19]

Kieser et al.

[11] Patent Number: 4,661,409
[45] Date of Patent: Apr. 28, 1987

[54] METHOD OF PRODUCING AMORPHOUS CARBON COATINGS ON SUBSTRATES AND SUBSTRATES COATED BY THIS METHOD

[75] Inventors: Jörg Kieser, Albstadt; Michael Neusch, Hanau am Main, both of Fed. Rep. of Germany

[73] Assignee: Leybold-Heraeus GmbH, Cologne, Fed. Rep. of Germany

[21] Appl. No.: 797,635

[22] Filed: Nov. 13, 1985

Related U.S. Application Data

[62] Division of Ser. No. 606,920, May 4, 1984, Pat. No. 4,569,738.

[30] Foreign Application Priority Data

May 6, 1983 [DE] Fed. Rep. of Germany ....... 3316693

[51] Int. Cl.⁴ .................... B32B 9/00; C01B 31/00
[52] U.S. Cl. .................... 428/408; 428/447; 428/426; 428/441; 428/462; 428/689; 204/173
[58] Field of Search ................ 428/408, 447; 204/173

[56] References Cited

U.S. PATENT DOCUMENTS 4,181,772  1/1980  Chu et al. ........................... 428/447
4,412,903  11/1983  Green et al. ....................... 428/408
4,524,106  6/1985  Flasck ................................ 428/408

Primary Examiner—P. C. Ives
Attorney, Agent, or Firm—Felfe & Lynch

[57] ABSTRACT

A method for producing amorphous carbon coatings on substrates by degrading a gaseous hydrocarbon compound in an ionized gas atmosphere within a reaction chamber. An electromagnetic alternating field is used for the excitation of the plasma. To achieve the object of increasing the deposition rate and permitting substrates even of great surface area to be uniformly coated, the frequency of the electromagnetic alternating field is selected in the microwave region (915 to 2,540 MHz). Furthermore, the microwave energy is put into the gaseous atmosphere by means of at least one ladder-type waveguide situated outside of the reaction chamber. The invention also relates to a substance provided with an amorphous carbon coating, in which an adhesion-mediating coating consisting of a polymer from the group of the siloxanes or silazanes is provided between the substrate and the amorphous carbon coating.

1 Claim, 4 Drawing Figures

FIG. 1
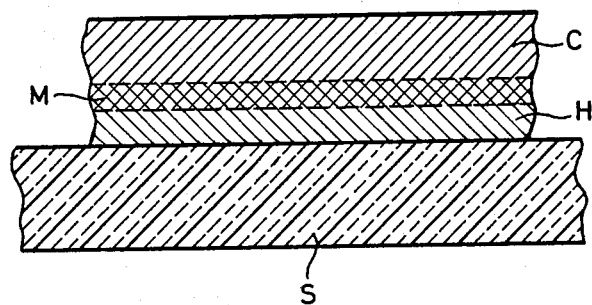
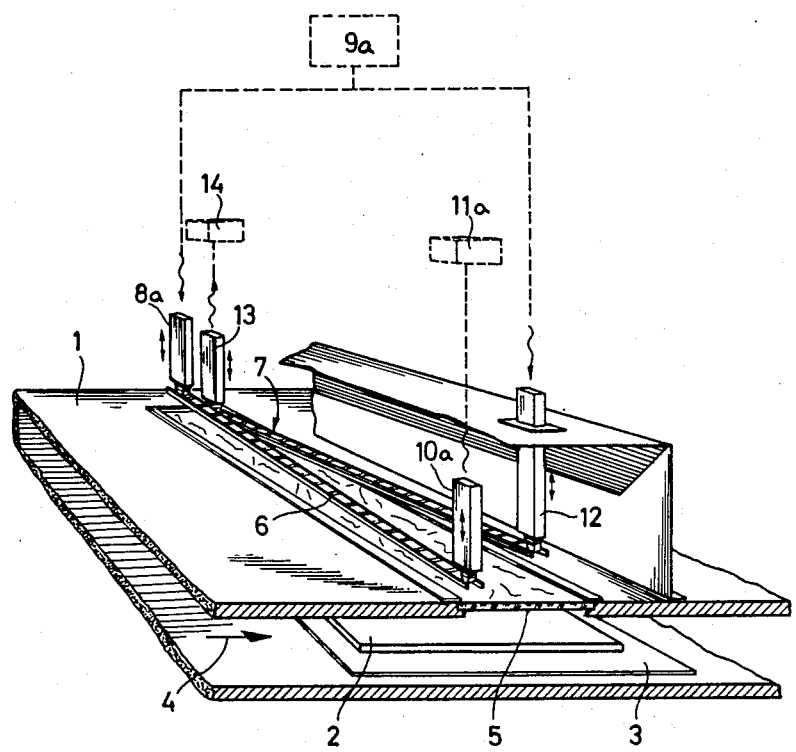
FIG. 2

METHOD OF PRODUCING AMORPHOUS CARBON COATINGS ON SUBSTRATES AND SUBSTRATES COATED BY THIS METHOD

This is divisional application of our copending application Ser. No. 606,920, filed May 4, 1984, now U.S. Pat. No. 4,569,738.

BACKGROUND OF THE INVENTION

The invention relates to a method of producing amorphous carbon coatings on substrates by the degradation of a gaseous carbon compound in an ionized gaseous atmosphere within a reaction chamber, using an alternating electromagnetic field to excite the plasma.

The term "amorphous" applied to carbon coatings originates from initial studies indicating a largely amorphous structure. In the meantime, later studies have proven that a typical diamantine bond is also present within small areas. The term is, therefore, one of art and not rigor.

At the present time, the following is known concerning the basic conditions under which an amorphous carbon coating can be produced: the energy of the carbon ions or hydrocarbon radicals impinging upon the substrate must exceed a certain threshold value; approximately 30 atomic percent of hydrogen can be incorporated in the coating, and, depending on the conditions of formation, different sub-nomenclatures have become established in the art for the coatings, viz:

amorphous carbon
i-carbon (i represents "ion assisted")
a-C:H (hydrogenated amorphous carbon)
diamond-like carbon.

The amorphous carbon coatings have great hardness. They are chemically inert and permeable to infrared radiation, so that there is a considerable demand for such coatings as mechanical and chemical protective coatings on a wide variety of substrates in common use, and as an optically active coating on special optical substrates permeable to infrared radiation.

German Offenlegungsschrift No. 1,736,514 and the corresponding British Pat. No. 1,582,231 discloses a process for coating a substrate with amorphous carbon in a reaction chamber in which the substrate with the substrate holder forms one plate of a capacitor to which an electrical frequency of between 0.5 and 100 MHz is applied to produce a coating plasma from a monomer gas in the reaction chamber. The other plate of the capacitor can be the floor of the reaction chamber, but it can also be formed by a second plate in the reaction chamber. In either case, both plates are in the reaction chamber and consequently also exposed to the ionized gaseous atmosphere, and this would have to be the case in any event with the plate which forms the substrate holder. Contamination of the coating with the plate material can result.

Experience has shown, moreover, that the known method and apparatus can only achieve rates of carbon deposition of between 1.0 and 3.0 nm/sec. It is also difficult to obtain sufficient uniformity of coating thickness, because variations in the coating thickness can be caused by an irregular energy input into the plasma, and differences in monomer concentration near the substrate. This is further complicated by the fact that gaseous reaction products are formed as the coating builds up, which must be continuously pumped out. By the presently known method, in the case of planar substrates of a diameter of only 20 cm, thickness irregularities of approximately 5% are achieved over the entire area. Evidently this is true of no more than laboratory-scale production, which is not easily, if at all, transferrable to large technical processes.

It is therefore an object of the invention to provide a method of the kind described above, whereby the rates of deposition can be considerably increased and substrates of large area can be uniformly coated.

SUMMARY OF THE INVENTION

In accordance with the invention, a method of producing an amorphous carbon coating on a substrate within a reaction chamber comprises introducing a gaseous hydrocarbon compound within the reaction chamber and applying by at least one ladder-like wave guide an electromagnetic alternating field having a frequency in the microwave region to ionize the gaseous hydrocarbon compound to produce an amorphous carbon coating on the substrate.

Also in accordance with the invention, a substrate has an amorphous carbon coating and has between the substrate and the amorphous carbon coating an adhesion-mediating coating of a polymer selected from the group of siloxanes and silazanes.

The above-stated object is achieved in accordance with the invention, in the method described above, by selecting the frequency of the alternating electromagnetic field in the microwave region, and by delivering the microwave energy to the gaseous atmosphere by means of at least one ladder-like wave-guide structure situated outside of the reaction chamber.

The microwave region lies in a frequency range extending from about 915 to 2,540 MHz, i.e., the frequency is higher by at least a factor of about 10 than the frequency used in the state of the art. By the increase of the frequency, in conjunction with a corresponding output power increase, a deposition rate greater by at least a factor of 7 is achieved, i.e., by the method of the invention, deposition rates of about 20 nm/sec can be achieved easily. By situating the energy source for the excitation of the gas plasma, i.e., the ladder-like wave-guide structure, outside of the reaction chamber and thus outside of the gaseous atmosphere, the energy input can be considerably increased without incurring problems that cannot be controlled electrically and thermally. The ladder-like waveguide, which of itself belongs to the state of the art, permits a uniform energy input over its entire length, so that the uniformity of the coating thickness, in conjunction with a relative movement of the substrate with respect to the waveguide structure, can be substantially improved. Even if the area of the substrate is increased, coatings can be produced in which the differences in thickness amount to less than about 3 to 4%.

Despite the high rates of deposition, the coatings achieved are extraordinarily hard, and have a high chemical stability, so that they can be used preferentially as protective coatings for a great number of substrates.

Suitable carbon compounds either in gaseous form or in a form which can be converted to the gaseous state are acetylene, benzene, methane, and other hydrocarbons in chain or cyclic form, preferably those which have multiple bonds.

While the method described above results in adequate strength of adhesion to special substrate materials such as germanium, in the case of mineral glass, metals, plastics and inorganic insulating material, the strength of adhesion can be further improved in the following manner:

(a) In an initial step in the method, a gas from the group of the siloxanes or silazanes is introduced into the reaction chamber.

(b) A ground coating of a polymer of the siloxanes or silazanes is formed on the substrates.

(c) Then the gaseous hydrocarbon compound is introduced into the reaction chamber.

(d) The amorphous carbon coating is formed on the ground coat.

The polymers formed of siloxane and/or silazane have proven to be excellent adhesion mediators, with respect to both the substrate material and the amorphous carbon coating. With regard to the strength of adhesion between the siloxane or silazane layer and the amorphous carbon coating, the following is also important: The reaction chamber, even in the case of a deliberate interruption of the siloxane or silazane feed, contains a certain amount of this gas, which gradually is consumed by condensation on the substrate surface. If, while sustaining a pressure-controlled gas supply, the gaseous hydrocarbon is introduced after the delivery of siloxane or silazane has ended, the silazane or siloxane concentration decreases approximately simultaneously while the concentration of the hydrocarbon compound is increasing. This procedure results in a gradual transition from one coating material to the other, which can be interpreted as a kind of interlocking between the coating materials. This method can be further improved by gradually throttling the delivery of the first reaction gas (siloxane, silazane) and gradually increasing the rate of delivery of the hydrocarbon compound to the rate required for stationary operation, thereby widening the zone of transition, thus still further increasing the adhesion effect.

It is furthermore possible to increase the hardness of the adhesion-mediating coating substantially by delivering the gases from the group of the siloxanes or silazanes to the reaction chamber in a mixture with an oxygen-containing gas or pure oxygen, the content of the oxygen-containing gas or oxygen being selected between 10 and 50%, by volume, of the total amount of gas. It is always advantageous to give the adhesion-mediating coating great hardness, even though it be very thin, in order to further improve the durability of the amorphous carbon coating, which in itself is very hard.

The invention also relates to a substrate provided with an amorphous carbon coating, in which an adhesion-mediating coating consisting of a polymer from the group of the siloxanes or silazanes is interposed between the substrate and the amorphous carbon coating.

Additional advantageous developments of the subject matter of the invention will be seen in the subordinate claim.

For a better understanding of the present invention, together with other and further objects thereof, reference is made to the following description, taken in connection with the accompanying drawings, and its scope will be pointed out in the appended claim.

An embodiment of the subject matter of the invention and an apparatus for the performance of the method of the invention will be now be described, in conjunction with FIGS. 1 to 4.

BRIEF DESCRIPTION OF THE DRAWINGS

FIG. 1 represents a cross section taken through a coated substrate,

FIG. 2 is a simplified perspective representation of an apparatus for the performance of the method of the invention.

DESCRIPTION OF PREFERRED EMBODIMENTS

Figure 3:
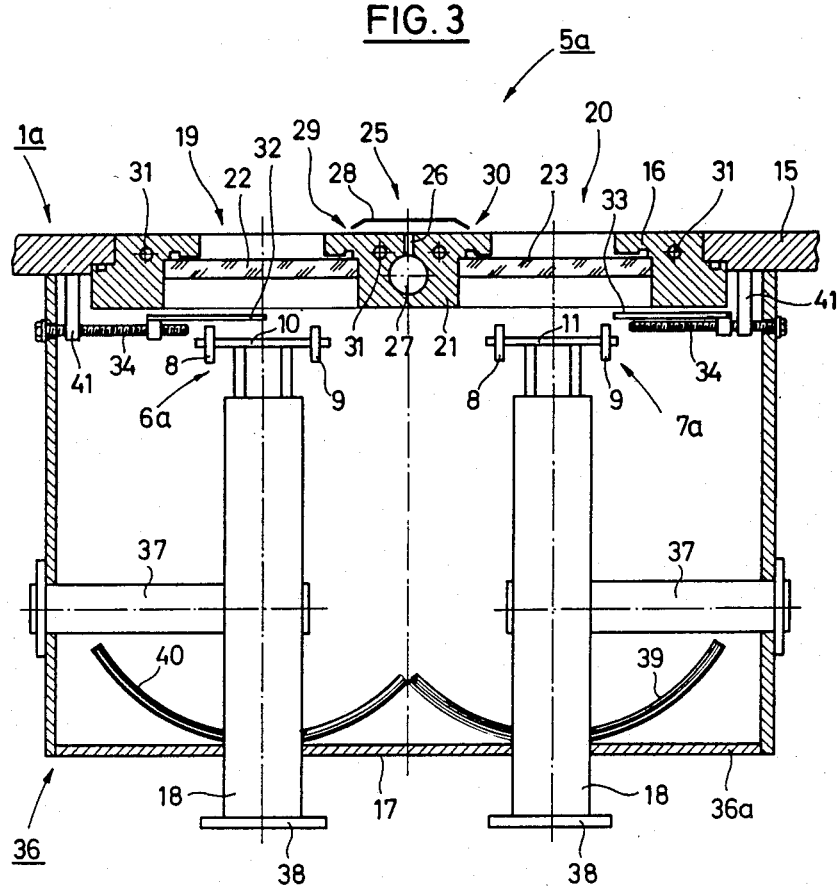
FIG. 3 is a cross section of apparatus similar to that of FIG. 2, but in substantially greater detail, namely through a window supporting frame having two windows and ladder-like waveguides disposed in front of each window.

In FIG. 1 a substrate S consisting of mineral glass is represented, on which an adhesion-mediating coating H composed of a polymer of a siloxane or silazane is provided, on which, in turn, there is applied an amorphous carbon layer C in accordance with the invention. Between the two layers is a zone of transition or mixture M, which extends between two boundary surfaces represented in broken lines. At the bottom boundary surface the composition amounts to 100% of the polymer of the siloxane or silazane, while the composition at the upper boundary surface amounts to 100% of the amorphous carbon coating. Between these two boundary surfaces, the transition from the one to the other of the two coating materials is virtually continuous.

In FIG. 2 there is represented a reaction chamber 1 in which a substrate 2 of planar form is disposed on a planar substrate holder 3. The substrate 2 is transportable through the reaction chamber 1 in the direction of the arrow 4 by the substrate holder.

The substrate holder 3 can be transported between a supply magazine, which is not shown, and a receiving magazine, which also is not shown, the magazines being disposed one at each end of the reaction chamber 1. However, loading locks can also be provided at the two ends of the reaction chamber.

These principles of the construction of reaction chambers and locks or pressure stages, however, are the state of the art, so that there is no need to go further into the discussion thereof.

The reaction chamber 1 made of metal is provided with a window 5 of a material permeable to microwaves, such as vitreous fused silica or aluminum oxide ceramic, polytetrafluorethylene etc. The window is rectangular in plan, the length amounting to at least the width of the substrate 2 or of the substrate holder 3 transversely of the transport direction (arrow 4).

Above the window 5, two ladder waveguides 6 and 7 are disposed, each consisting, in accordance with FIG. 3, of two parallel straight rods 8 and 9 having between them crossbars 10 and 11 of equal length which are in metal-to-metal contact with the rods 8 and 9.

The crossbars 10 and 11 are alternately connected electrically to one of two central conductors which have been omitted for the sake of simplicity. The configuration and arrangement of such ladder waveguides are set forth in detail in U.S. Pat No. 3,814,983, especially in FIGS. 4 to 8.

In accordance with FIG. 2, the first ladder waveguide is connected by a waveguide 8a to a microwave transmitter, the connection being indicated only diagrammatically by a broken line. The microwave generator of the microwave transmitter 9a preferably is a magnetron. The coupling of the ladder waveguide 6 to the hollow waveguide 8a is likewise state of the art and represented by way of example in U.S. Pat. No. 3,814,983, FIGS. 4 and 5. The far end of the ladder waveguide 6 is connected by another hollow waveguide 10a to a so-called dummy load 11 constituting a microwave short circuit. The ladder waveguide 6 runs at an acute angle to the window 5 and to the substrate carrier 3, the greatest distance being at the end at which the hollow waveguide 8a is located. The angle can be varied by displacing the hollow waveguide 8a in the directions indicated by the double arrow represented on the left side thereof. The angle is selected such that a uniform energy input into the plasma is produced over the length of the ladder waveguide, assuming constant discharge parameters.

The ladder waveguide 7, which preferably is also disposed lengthwise normal to the direction of transport of the substrate, is disposed alongside the ladder waveguide 6; however, it slopes in the opposite direction and forms the same acute angle with the substrate surface. The end of the ladder waveguide 7 that is farthest away from the substrate surface is also connected by a hollow waveguide 12 to the same microwave transmitter 9, in an entirely similar manner. The far end of the ladder waveguide is, again in an entirely similar manner, connected by another hollow waveguide 13 to another dummy load 14. All of the hollow waveguides 8a, 10a, 12 and 13 are disposed for longitudinal displacement in the direction of the double arrows for the purpose of a precise alignment of the ladder waveguides 6 and 7 relative to the substrate surface. A fine adjustment of the coating thickness distribution can additionally be achieved by adjusting the power distribution on the two ladder waveguides.

The plasma is formed within the reaction chamber which contains the reactive gases, such as siloxane or silazane for the adhesion-mediating coat and/or a gaseous hydrocarbon for the formation of the amorphous carbon coating. Oxygen or an oxygen-containing gas such as water vapor can additionally be introduced into the reaction chamber 1.

By means of the ladder waveguides 6 and 7, two elongated, plasma-filled spaces are formed beneath the window 5, through which the substrates run successively. It is apparent that the ladder waveguides 6 and 7 together with the terminally disposed waveguides, in their projection onto the window 5, lie within the open cross section of the latter. Those waveguides 8a and 12 through which the injection of power into the plasma is performed, lie at opposite ends of the substrate carrier, as seen transversely of the transport direction indicated by arrow 4.

Additional details of such an apparatus are disclosed in German Offenlegungsschrift No. 3,147,986.

FIG. 3 shows further details of a window 5a, which is a variant of the window 5 of FIG. 2. The reaction chamber 1a has several chamber walls, including a front wall 15 in which a supporting frame 16 is releasably fastened, in front of which there is a microwave shield 17 in the form of an oblong casing. In front of this casing, microwave transmitters and dummy loads are disposed in an out-of-parallel arrangement similar to FIG. 2, but they are not shown here.

The supporting frame 16 is of rectangular construction and is provided with two window openings 19 and 20 running parallel to the longer sides of the rectangle. Between the window openings is a frame member 21 running in the direction of the longest axis of symmetry of the supporting frame 16. A window 22 and 23, for example, of vitreous fused silica transparent to microwaves is situated in each of the window openings 19 and 20. The central frame member 21 has, along its longest axis, a means 25 for the distribution of the reaction gases referred to above, which in the present case consists of a plurality of openings 26 leading into the interior of the reaction chamber. The openings 26 are perpendicular to a longitudinal bore 27 in the central frame member 21, which in turn is connected, in a manner not shown, to a conduit delivering the gases from which a surface coating is to be formed on the substrate by the plasma reaction. A solid spreader plate 28 runs parallel to the longitudinal bore 27 opposite all of the openings, and its parallel longitudinal margins are slightly bent, as indicated, toward the central frame member 21, so that between the central frame member 21 and the spreader 28 two gas discharge gaps 29 and 30 are formed, which extend over the entire length of the central frame member. If a substrate is moved parallel to the windows 22 and 23 in a direction perpendicular to the long axis of the central frame member 21, the entire width of the substrate will be swept with a uniform stream of the reaction gases. Under the effect of the glow discharges burning in back of the windows 22 and 23, the desired coating forms on the surface of the substrate.

As seen in FIG. 3, cooling passages 31 are provided in the supporting frame 26 including the central frame member 21, through which cooling water flows during operation and which keep the overall temperature level of the supporting frame 16 low.

FIG. 3 also indicates, between the ladder waveguides 6a and 7a and the window openings 19 and 20, the adjusting shutters 32 and 33 whereby the distribution of the energy input into the reaction chamber longitudinally of the window openings 19 and 20 can be controlled. The adjusting shutters are fastened at both their extremities to adjusting spindles 34 which permit an adjustment of the position of the shutters 32 and 33 parallel to the plane of the windows.

As shown in FIG. 3, the ladder waveguides 6a and 7a are surrounded on the side opposite the windows 22 and 23 by a common microwave shielding 36 in the form of a rectangular metal box that is open on the window side. The waveguides corresponding to waveguides 8a, 10a, 12 and 13 of FIG. 2 are fastened to the microwave shielding by means of the supports 37, so that the result is a fixed spatial relationship of the waveguides and of the waveguide ladders 6a and 7a connected to the waveguides. The microwave transmitters and dummy loads are connected by means of terminal flanges 38. The microwave shield 36 has a back wall 36a through which the waveguides 18 are brought. Two reflectors 39 and 40, which are in the form of partially cylindrical troughs facing the waveguide ladders 6 and 7 and window openings 19 and 20, are disposed parallel to the back wall 36a. By virtue of these reflectors a substantially greater portion of the microwave power enters into the interior of the reaction chamber 1.

Figure 4:
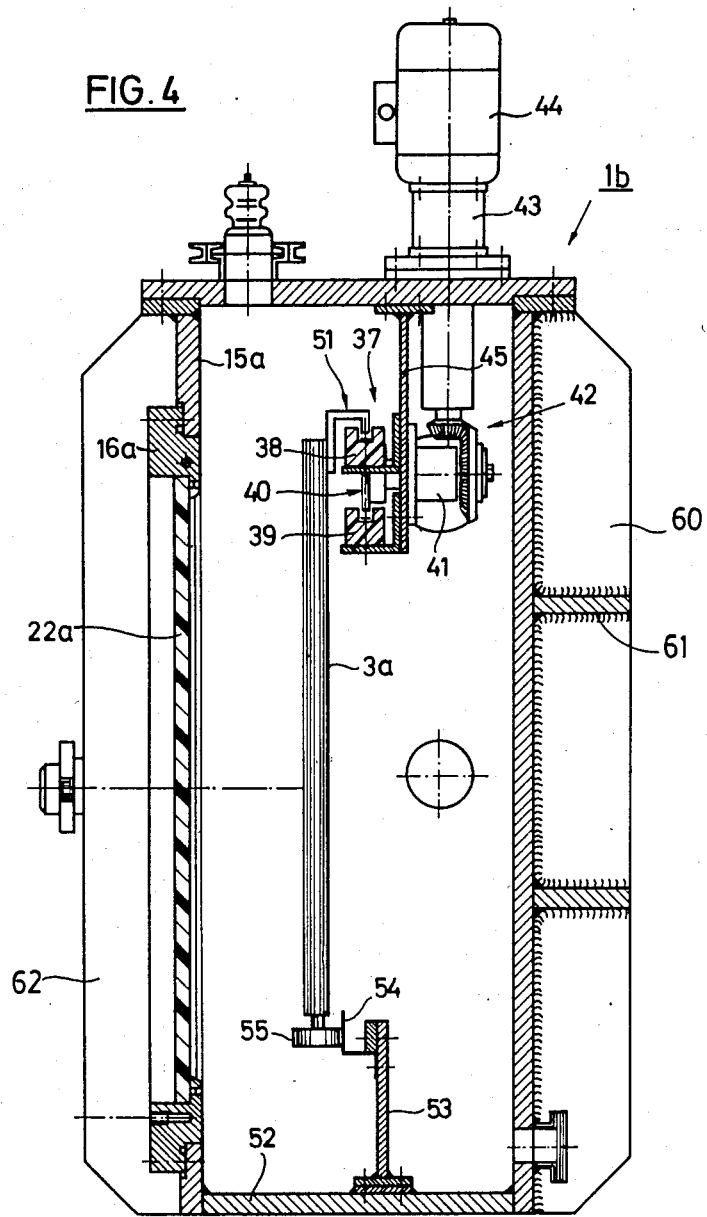
FIG. 4 is a vertical cross section through a reaction chamber set up vertically, in which the substrate holder and its drive are suspended vertically.

In FIG. 4, only the supporting frame corresponding to frame 26 and one of the two windows corresponding to windows 22 shown in FIG. 3 are represented. All of the rest of the parts of the apparatus situated outside of the reaction chamber 1a in FIG. 3 have been omitted for the sake of simplicity.

In FIG. 4 there is shown a vertical cross section through a vertically disposed reaction chamber 1b in the area of the supporting frame 16a and a window 22a transparent to microwaves, the direction of transport of the substrate holder 3a being perpendicular to the plane of the drawing. The substrate holder 3a is a planar plate suspended vertically, which is aligned parallel with the window. The substrate holder 3a is suspended by means of a bracket 51 from the upper run of an endless chain forming part of a transport system 37. The chain is passed around two sprockets, one in front of and the other behind the plane of the drawing. Two channel-shaped guides 38 and 39 made of a plastic that has low friction under the process conditions provide for the support of each run of the chain. The sprocket 40 situated in back of the plane of the section is mounted in a bearing 41 and is connected by an angle gear drive 42 and reduction gearing 43 to a drive motor 44. The sprockets 40, together with their bearing 41 plus the guides 38 and 39, are fastened to a supporting frame 45 which extends through the entire length of the reaction chamber 1. By means of the transport system it is possible to move the substrate holders 3a back and forth in the direction of the longest axis of the reaction chamber 1. The assembly represented in FIG. 4 is to be considered as being attached to the front wall 15a and to the supporting frame 16a.

In FIG. 4 it can also be seen that supports 53 bearing a continuous guide rail 54 are affixed to the floor 52 of the reaction chamber 1a. The substrate holder 3a engages this rail with a roller 55 to prevent the substrate holder from rocking or being deflected laterally. The reaction chamber 1a is reinforced by braces 60, 61 and 62 to withstand the low operating pressure. The substrate holder 3a can hold the substrate in position by any suitable means, for example, clamps (not shown).

EXAMPLES

Example 1

In an apparatus in accordance with FIGS. 3 and 4, a glass substrate measuring 0.4×0.4 meter was placed in the reaction chamber on an uncooled substrate holder. After the vessel had been evacuated to a pressure of less than $10^{-4}$ mbar, hexamethyldisiloxane was let in and the feed thereof adjusted such that a constant pressure of $1 \times 10^{-2}$ mbar established itself. With an input power of 2 kW at 1.45 GHz in both ladders, a pressure of $4 \times 10^{-2}$ mbar established itself immediately after the ignition of the plasma. After two seconds the hexamethyldisiloxane feed was interrupted and replaced by acetylene while sustaining the operating pressure. After a stay of 50 sec in the plasma, the total thickness of the combined coatings was 1 micron, which corresponds to an average rate of deposition of 20 nm/s. The coating thickness variation over the entire surface of the substrate amounted to ±4%.

In the examination of the coating the following findings were made: the coating, with an index of refraction of 1.8, has a transmission in the infrared range averaging 95%. Also, in the infrared spectrum there were no indications of multiple carbon bonds. The coating is very hard (VH 5000 kg/mm$^2$) and has a substantially greater strength of adhesion than coatings with no adhesion mediator.

Example 2

In a second experiment, under otherwise identical conditions, benzene was used instead of acetylene. The coating that formed had the same properties as in Example 1.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A substrate having an amorphous carbon coating and having between the substrate and the amorphous carbon coating an adhesion-mediating coating of a polymer selected from the group of siloxanes and silazanes, the amorphous carbon coating being produced by applying, by at least one ladder-like wave guide disposed transversely of a direction of transport of the substrate within a reaction chamber and which is aligned at an acute angle with the substrate surface and is connected at one end to a microwave transmitter, an electromagnetic alternating field having a frequency in the microwave region and having a sufficiently high power to ionize a gaseous hydrocarbon compound and to bring the energy of the carbon-containing ions impinging on the substrate above a threshold value sufficient to produce an amorphous carbon coating on the adhesion-mediating coating on the substrate.

* * * * *